(12) United States Patent
Lee et al.

(10) Patent No.: US 7,985,993 B2
(45) Date of Patent: Jul. 26, 2011

(54) CMOS IMAGE SENSOR AND IMAGE SIGNAL DETECTING METHOD THEREOF

(75) Inventors: Dong-Myung Lee, Seodaemun-gu (KR);
Dong-Soo Kim, Seodaemun-gu (KR);
Gun-Hee Han, Goyang-si (KR);
Seog-Heon Ham, Suwon-si (KR)

(73) Assignee: Samsung Electronics Co., Ltd.,
Suwon-si, Gyeonggi-do (KR)

( * ) Notice: Subject to any disclaimer, the term of this patent is extended or adjusted under 35 U.S.C. 154(b) by 743 days.

(21) Appl. No.: 11/874,404

(22) Filed: Oct. 18, 2007

(65) Prior Publication Data

US 2008/0111057 A1    May 15, 2008

(30) Foreign Application Priority Data

Nov. 13, 2006    (KR) .................. 10-2006-0111800

(51) Int. Cl.
*H01L 27/00*    (2006.01)
(52) U.S. Cl. ............. 257/292; 257/E27.133; 250/208.1; 348/308
(58) Field of Classification Search .................. 257/292, 257/E27.133, 75, 291, E27.131, E27.132; 348/308; 259/208.1; 250/208.1
See application file for complete search history.

(56) References Cited

U.S. PATENT DOCUMENTS

| 6,821,808 | B2 | 11/2004 | Nakamura et al. | |
|---|---|---|---|---|
| 7,301,487 | B2 | 11/2007 | Funakoshi et al. | |
| 2001/0020909 | A1* | 9/2001 | Sakuragi et al. | 341/139 |
| 2002/0118289 | A1* | 8/2002 | Choi | 348/308 |
| 2007/0007434 | A1 | 1/2007 | Pain | |

FOREIGN PATENT DOCUMENTS

| JP | 06-153096 | 5/1994 |
|---|---|---|
| JP | 2000-152090 | 5/2000 |
| JP | 2001-078096 | 3/2001 |
| JP | 2001203936 | 7/2001 |
| JP | 2001-230936 | 8/2001 |
| JP | 2002-330348 | 11/2002 |
| JP | 2003-174596 | 6/2003 |
| JP | 2008136042 | 6/2008 |
| KR | 1020060104197 A | 10/2006 |
| KR | 1020070028210 A | 3/2007 |

OTHER PUBLICATIONS

U.S. Appl. No. 12/828,478, filed Jul. 1, 2010; Inventors Seung hyun Lim and Jeong hwan Lee.

* cited by examiner

*Primary Examiner* — Thomas L Dickey
*Assistant Examiner* — Fazli Erdem
(74) *Attorney, Agent, or Firm* — Volentine & Whitt, PLLC

(57) ABSTRACT

A complementary metal oxide semiconductor (CMOS) image sensor includes a photodiode, a switch and a comparator. The switch transfers a sensing signal to a sensing node from the photodiode. The comparator, which is directly connected to the sensing node, compares the sensing signal of the sensing node with a reference signal. The comparator outputs a signal corresponding to a voltage difference between the sensing signal and the reference signal.

11 Claims, 6 Drawing Sheets

CMOS IMAGE SENSOR AND IMAGE SIGNAL DETECTING METHOD THEREOF

CROSS-REFERENCE TO RELATED APPLICATIONS

A claim of priority is made to Korean Patent Application No. 10-2006-0111800 filed on Nov. 13, 2006, the subject matter of which is hereby incorporated by reference.

BACKGROUND

1. Field of the Invention

The present invention disclosed herein relates to image sensors and more particularly, to a complementary metal oxide semiconductor (CMOS) image sensors which compare a sensing signal with a reference signal.

2. Description of the Related Art

CMOS image sensors widely used in digital cameras convert optical signals into electrical signals. This conversion occurs in pixels of the CMOS image sensor, each of which includes a photodiode and a read-out circuit. The photodiode generates charges induced by light that it absorbs. The charges generated are converted into an analog voltage and transferred to the read-out circuit. The read-out circuit converts the analog voltage into digital data.

An analog-to-digital conversion is performed by comparing the analog voltage of a pixel to a ramp voltage by means of a comparator. A counting value when the ramp voltage reaches to the analog voltage is adopted as the digital data converted from the analog voltage.

Generally, the pixel is structured to include four transistors. A first NMOS transistor initializes the pixel. A second NMOS transistor transfers the pixel's image information. A third NMOS transistor functions to select the pixel. A fourth NMOS transistor forms a source follower as a buffer for transferring the image information of the pixel.

However, when the pixel transfers a sensing signal (floating diffusion) to the read-out circuit through the source follower, the response signal is limited in a dynamic range and noise is increased.

SUMMARY OF THE INVENTION

An aspect of the present invention provides a complementary metal oxide semiconductor (CMOS) image sensor, including a photodiode, a switch and a comparator. The switch transfers a sensing signal to a sensing node from the photodiode. The comparator, which is directly connected to the sensing node, compares the sensing signal of the sensing node with a reference signal.

The comparator may include a first input transistor configured to be directly electrically connected to the sensing node, and a second input transistor configured to receive the reference signal. The comparator may output an output signal corresponding to a voltage difference between the sensing signal and the reference signal based on a comparison of the sensing signal with the reference signal. A voltage level of the reference signal may decrease over time. Also, the photodiode may receive external image information and output the sensing signal to the comparator corresponding to the external image information. The CMOS image sensor may be included in a digital camera.

Another aspect of the present invention provides a method for detecting an image signal in a CMOS image sensor. The method includes converting an optical signal into an electric signal; transferring the electric signal to a sensing node; and directly receiving the electric signal from the sensing node and comparing the electric signal with a reference signal. The method may further include counting from a first time when comparing the electric signal with the reference signal begins to a second time when the reference signal drops below the electric signal.

BRIEF DESCRIPTION OF THE FIGURES

Non-limiting and non-exhaustive embodiments of the present invention will be described with reference to the following figures, in which.

DETAILED DESCRIPTION OF THE EMBODIMENTS

Figure 1:
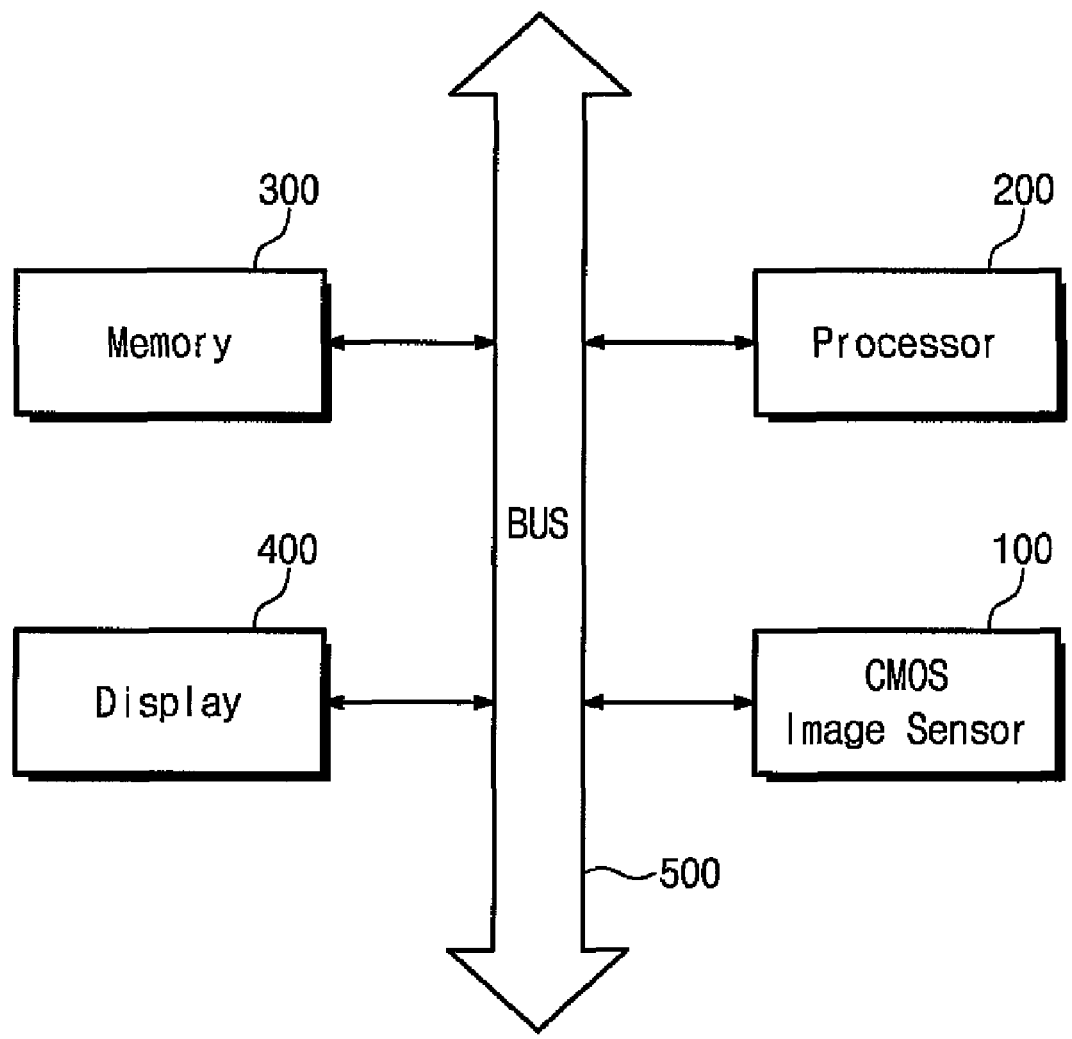
FIG. 1 is a block diagram showing a digital camera system including a CMOS image sensor.

The present invention will now be described more fully with reference to the accompanying drawings, in which exemplary embodiments of the invention are shown. The invention, however, may be embodied in various different forms, and should not be construed as being limited only to the illustrated embodiments. Rather, these embodiments are provided as examples, to convey the concept of the invention to one skilled in the art. Accordingly, known processes, elements, and techniques are not described with respect to some of the embodiments of the present invention. Throughout the drawings and written description, like reference numerals will be used to refer to like or similar elements, unless otherwise specified.

The various embodiments of the present invention provide a CMOS image sensor that extends a dynamic range of a sensing signal by directly inputting the sensing signal into a comparator. Also, the CMOS image sensor reduces noise by directly inputting the sensing signal into the comparator.

FIG. 1 is a block diagram showing an exemplary digital camera system including a CMOS image sensor. According to FIG. 1, the digital camera system includes a CMOS image sensor 100, a processor 200, a memory 300, a display 400, and a bus 500. The CMOS image sensor 100 captures external image information in response to the control by the processor 200.

The processor 200 stores the captured image information in the memory 300 through the bus 500. The processor 200 also outputs the image information to the display 400 from the memory 300. The present invention is directed to an architectural feature of the CMOS image sensor 100.

Figure 2:
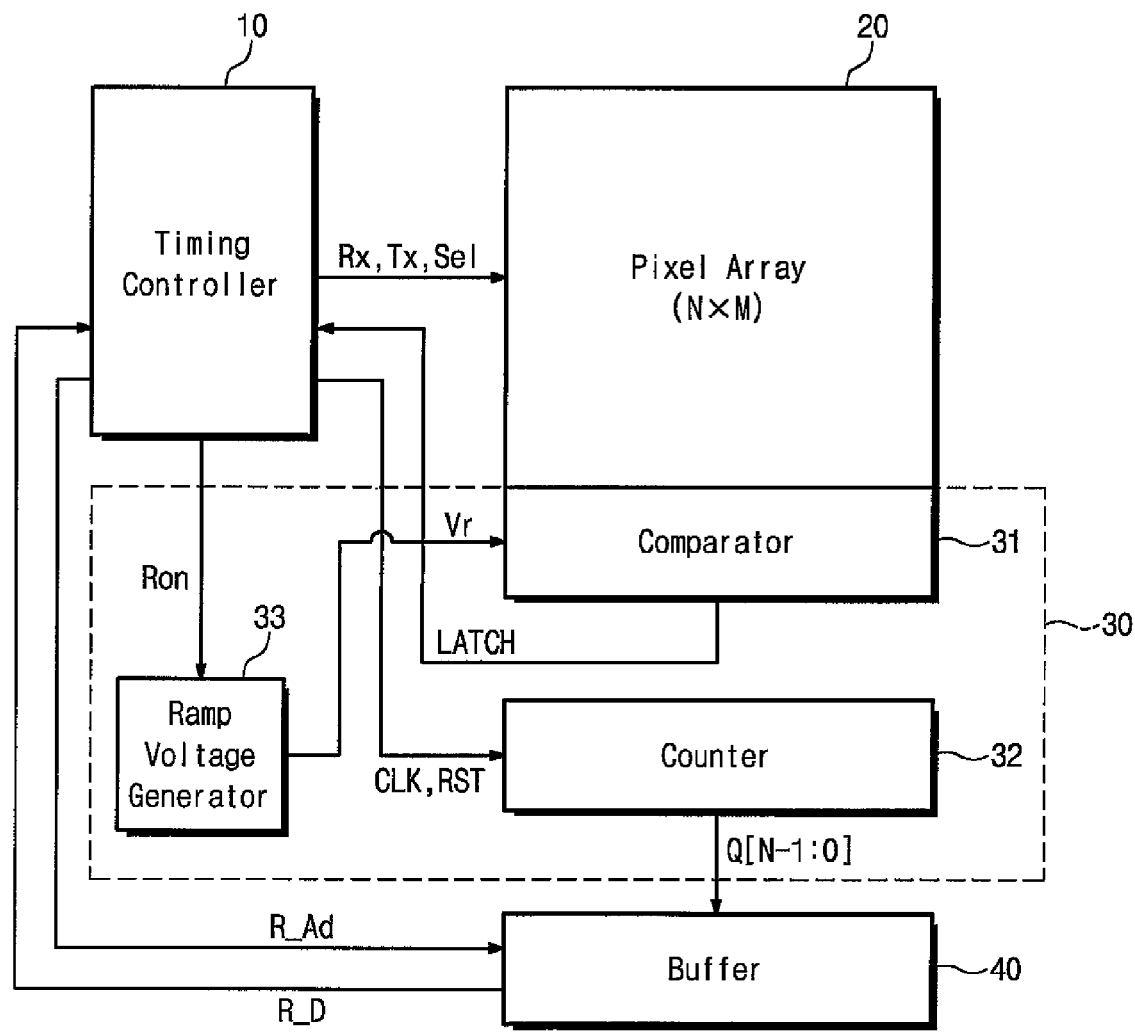
FIG. 2 is a block diagram showing a CMOS image sensor, according to an exemplary embodiment of the present invention.

FIG. 2 is a block diagram showing the CMOS image sensor, according to an exemplary embodiment of the present invention. Referring to FIG. 2, the CMOS image sensor 100 includes a timing controller 10, a pixel array 20, an analog-to-digital converter (ADC) 30, and a buffer 40. The ADC 30 includes a comparator 31, a counter 32, and a ramp voltage generator 33.

Figure 4:
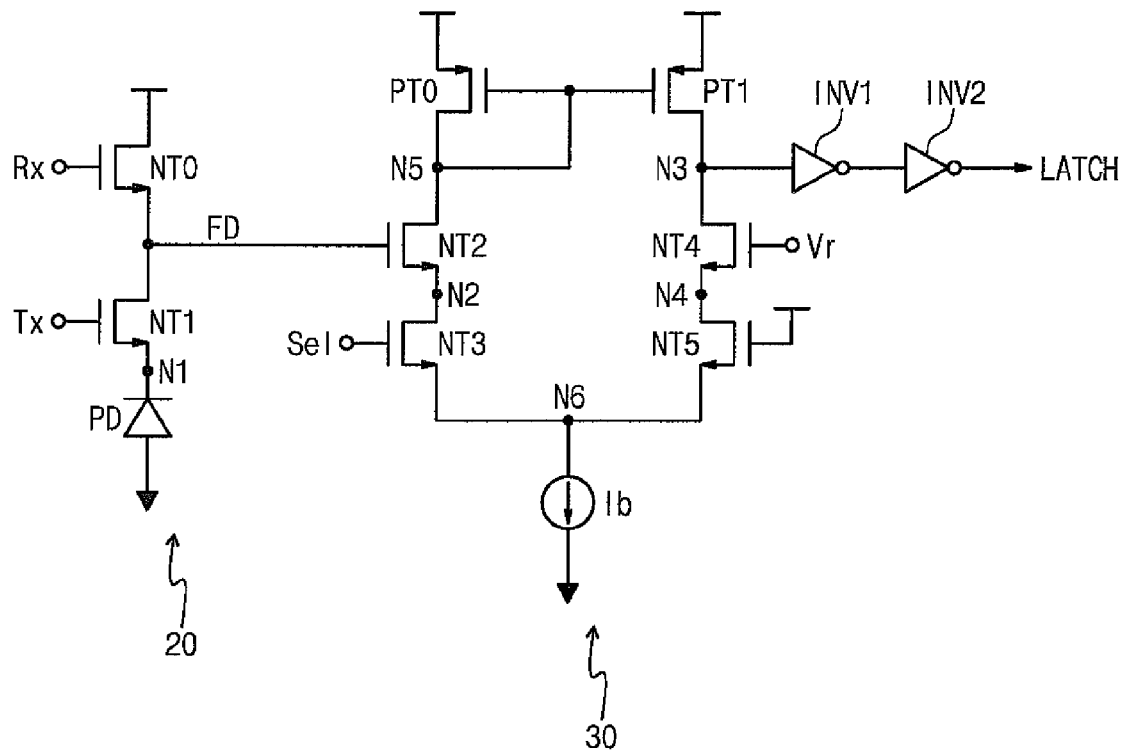
FIG. 4 is a circuit diagram illustrating a comparator, according to an exemplary embodiment of the present invention.

The pixel array 20, which receives external analog image information, is coupled to the comparator 31. FIG. 4 illustrates the circuit of the pixel array 20 and the comparator 31, in detail.

The pixel array 20 outputs analog signal Va (not shown) in response to control signals Rx, Tx, Sel of the timing controller 10. The comparator 31 receives the analog signal Va and a ramp signal Vr from the ramp voltage generator 33. In the depicted embodiment, the ramp signal Vr is designed to fall with respect to time. However, the ramp signal Vr may have a characteristic in which voltage rises with respect to time, without departing from the spirit and scope of the present invention.

The counter 32 begins counting, e.g., from the point when the comparator 31 begins comparing the analog signal Va with the ramp signal Vr, in response to a clock signal CLK and a control signal RST. The comparator 31 conducts an operation to compare the analog signal Va with the ramp signal Vr, and then transfers a latch signal LATCH, which corresponds to a voltage gap or difference between the analog signal Va with the ramp signal Vr, to the timing controller 10.

The counter 32 stops counting in response to the clock signal CLK provided from the timing controller 10. A counting value stored in the counter 32 is digital data corresponding to the analog signal Va. The analog signal converted into the digital data is stored in the buffer 40. The timing controller 10 transfers a control signal R_Ad, and receives a data signal R_D.

Figure 3:
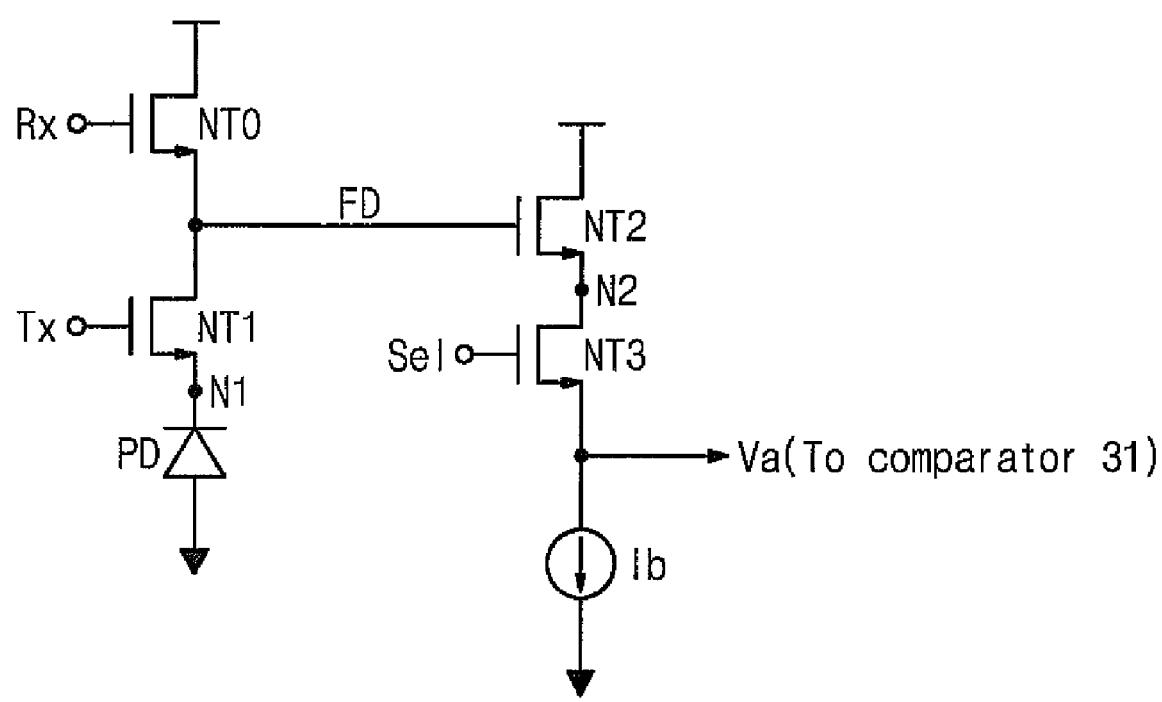
FIG. 3 is a circuit diagram illustrating a pixel shown in FIG. 2, according to an exemplary embodiment of the present invention.

FIG. 3 is a circuit diagram illustrating the pixel shown in FIG. 2. The pixel shown in FIG. 3 corresponds to a single pixel among N×M pixels arranged in the pixel array 20. Referring to FIGS. 2 and 3, the pixel (hereinafter, associated with the reference numeral "20" indicating that it is an exemplary pixel in the pixel array) includes four transistors NT0 to NT3 and a current source Ib. In the pixel 20, a first transistor NT0 is connected between a power source voltage and a sensing node FD, and responds to the reset signal Rx. A second transistor NT1 is connected between the sensing node FD and a first node N1, and responds to the transmission signal Tx. The pixel 20 also includes a photodiode PD coupled between the first node N1 and a ground voltage. The sensing signal FD is output from the first node N1, such that the second transistor NT1 may operate as a switch for transferring a sensing signal to the sensing node FD from the photodiode PD.

Additionally, in the pixel 20, the third transistor NT2 is connected between the power source voltage and a second node N2, and responds to the sensing node FD. The fourth transistor NT3 is connected between the second node N2 and the current source Ib, and responds to the selection signal Sel.

The first transistor NT0 functions to initialize the pixel 20 in response to the reset signal Rx from the timing controller 10. The second transistor NT1 functions to transfer a sensing signal from the photodiode PD in response to the transmission signal Tx from the timing controller 10. The third transistor NT2 and the current source Ib act as a buffer. Thus, the third transistor NT2 becomes restrictive in a dynamic range of the sensing node FD coupled to its gate. In other words, when a voltage of the sensing node FD is at a level of the power source voltage, the analog signal Va transferred to the comparator 31 is a difference between the power source voltage and a threshold voltage of the third transistor NT2.

As the analog signal Va received through the sensing node FD is transferred to the comparator 31 by way of the third and fourth transistors NT2 and NT3, there is noise on the analog signal Va due to the third and fourth transistors NT2 and NT3.

An analog signal input through the gate of the third transistor NT2 is transferred to the comparator 31. The fourth transistor NT3 functions to select one of the pixels in response to the selection signal Sel of the timing controller 10.

The timing controller 10 activates the reset and selection signals Rx and Sel to initialize the sensing node FD. The pixel 20 outputs the initialized analog signal Va to the comparator 31.

The timing controller 10 activates the transmission and selection signals Tx and Sel to transfer external image information to the sensing node FD from the photodiode PD. The pixel 20 outputs the analog signal Va corresponding to the external image information to the comparator 31.

The ADC 30 conducts a digital double-sampling (DDS) operation in order to convert an exact analog signal, which is provided from the pixel, into a digital signal.

In particular, the DDS operation obtains a difference between reset digital data Drst and signal digital data Dsig, i.e., Dsig−Drst. Drst is converted from an analog signal when the pixel is initialized for conversion of the exact analog signal to digital data. Dsig is converted from an analog signal corresponding to an image signal from a pixel inputting an external image signal.

FIG. 4 is a circuit diagram illustrating the comparator, according to an embodiment of the present invention. According to FIGS. 2 through 4, the pixel 20 includes the first transistor NT0 connected between the power source voltage and the sensing node FD and controlled by the reset signal Rx, the second transistor NT1 connected between the sensing node FD and the first node N1 and controlled by the transmission signal Tx, and the photodiode PD coupled between the first node N1 and the ground voltage. The sensing signal FD is output from the first node N1.

The pixel 20 also includes the third transistor NT2 connected between the second node N2 and a fifth node N5 and controlled by the sensing signal FD, and the fourth transistor NT3 connected between the second node N2 and a sixth node N6 and controlled by the control signal Sel. The current source Ib is connected between the sixth node N6 and the ground voltage.

The comparator 31 includes a seventh transistor PT0 connected between the power source voltage and the fifth node N5 and controlled by the fifth node N5, an eighth transistor PT1 connected between the power source voltage and a third node N3 and controlled by the fifth node N5, a fifth transistor NT4 connected between the third node N3 and a fourth node N4 and controlled by the ramp signal Vr, and a sixth transistor NT5 connected the fourth node N4 and a sixth node N6 and controlled by the power source voltage. The current source Ib is connected between the sixth node N6 and the ground voltage.

An output connected to the third node N3 is coupled to inputs of serially connected inverters INV1 and INV2 in order to raise an amplifying gain of the comparator 31.

The current source Ib, the fifth transistor NT4, the sixth transistor NT5, the seventh transistor PT0, and the eighth transistor PT1 constitute a differential amplifier along with the third and fourth transistors NT2 and NT3 included in the pixel 20. The differential amplifier forms the comparator with the inverters INV1 and INV2 for raising an amplifying gain.

When the timing controller 10 activates the control signals Rx and Sel to initialize the pixel 20, a voltage is generated from the sensing node FD corresponding to the initialized pixel. The voltage of the sensing node FD is applied to the gate of the third transistor NT2 and the ramp signal Vr is applied to the gate of the fifth transistor NT4. When the fourth transistor NT3 is turned on by activation of the control signal Sel, the comparator 31 transfers the output signal LATCH, corresponding to a difference between the voltage of the sensing node FD and the voltage of the ramp signal Vr, to the timing controller 10.

When the timing controller 10 activates the control signals Tx and Sel to input external image information into the pixel 20, a voltage is generated from the sensing node FD corresponding to the external image information. The sensing node FD is coupled to a gate of the third transistor NT2 and the ramp signal Vr is applied to the gate of the fifth transistor NT4. When the fourth transistor NT3 is turned on by activation of the control signal Sel, the comparator 31 provides the timing controller 10 with the output signal LATCH corresponding to a difference between a voltage of the sensing node FD and a voltage of the ramp signal Vr.

In the present embodiment, the pixel does not employ a source follower. Therefore, an output of the pixel, i.e., the sensing signal, is directly coupled to the comparator, so it is able to extend a dynamic range and have less noise.

Figure 5:
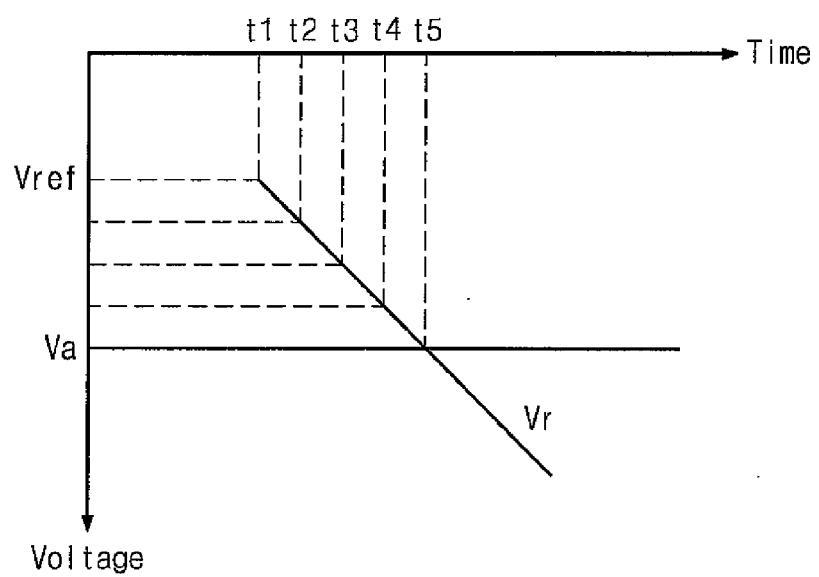
FIG. 5 is a graphic diagram comparing an analog signal with a ramp signal for illustrating an operation of the comparator shown in FIG. 2, according to an exemplary embodiment of the present invention.

FIG. 5 is a graphic diagram showing a comparison between the analog signal Va and the ramp signal Vr with respect to time, in order to illustrate an operation of the comparator shown in FIG. 2, according to an exemplary embodiment of the present invention. Referring to FIGS. 1 through 5, the ramp voltage generator 33 operates to generate the ramp signal Vr in response to a control signal Ron from the timing controller 10. The ramp signal Vr is a voltage signal having a voltage level that decreases over time from a reference voltage level Vref.

The comparator 31 operates to compare the analog signal Va with the ramp signal Vr, where Vref is greater than Va. During this comparison, the timing controller 10 activates the clock signal CLK to operate the counter 32.

During a period from t1 to t4, a voltage level of the analog signal Va is lower than that of the ramp signal Vr. After a time t5, the voltage level of the ramp signal Vr becomes lower than the voltage level of the analog signal Va, and the comparator 31 activates the comparison signal LATCH. The timing controller 10 does not generate the clock signal CLK when the comparison signal LATCH is activated. Thus, the comparator 31 and the counter 32 are suspended in operation. When the operations of the comparator 31 and the counter 32 are suspended, a counting value of the counter 32 becomes the digital data corresponding to the analog signal Va.

Figure 6:
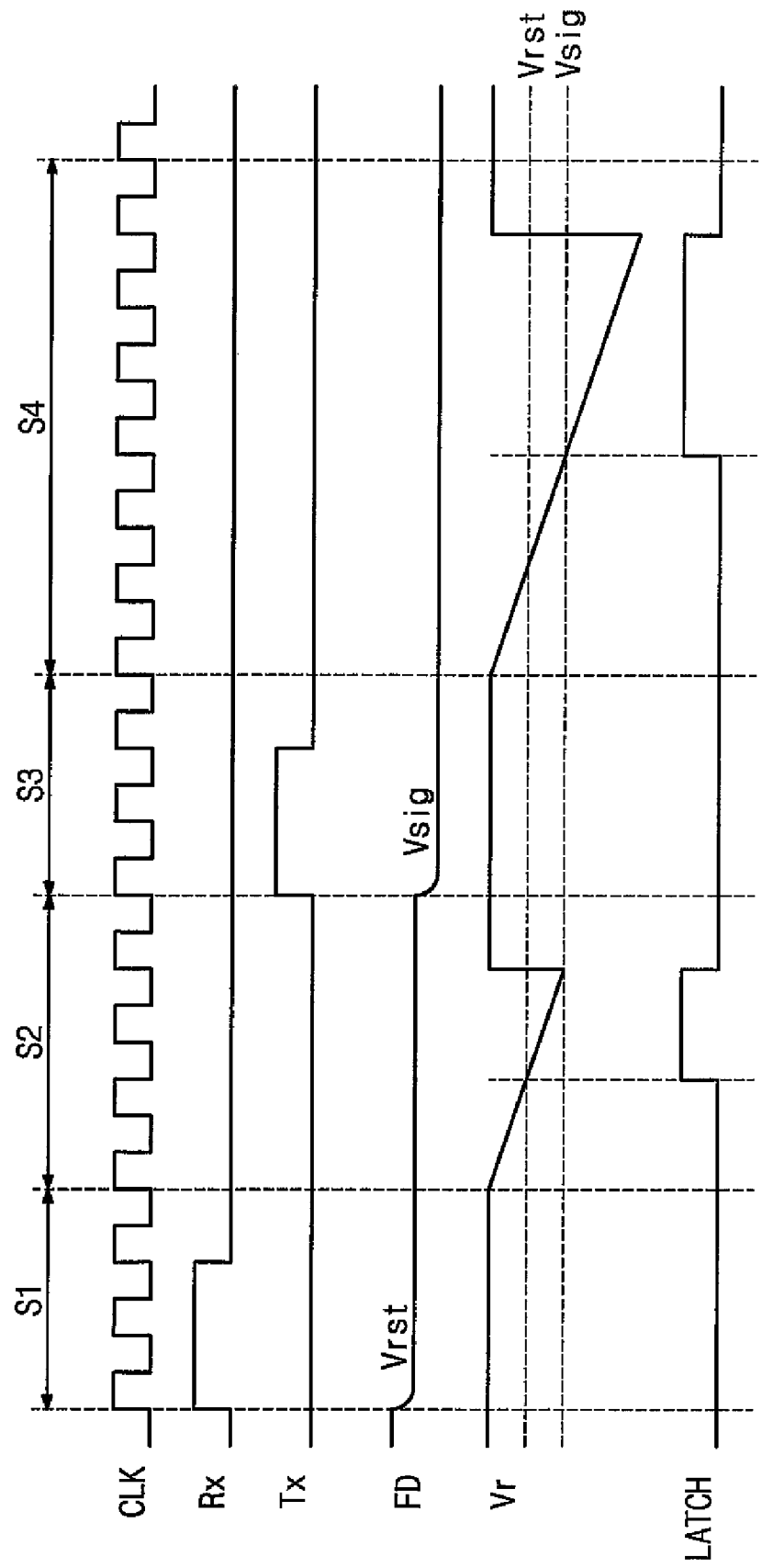
FIG. 6 is a timing diagram showing an operation of the CMOS image sensor, according to an exemplary embodiment of the present invention.
Figure 7:
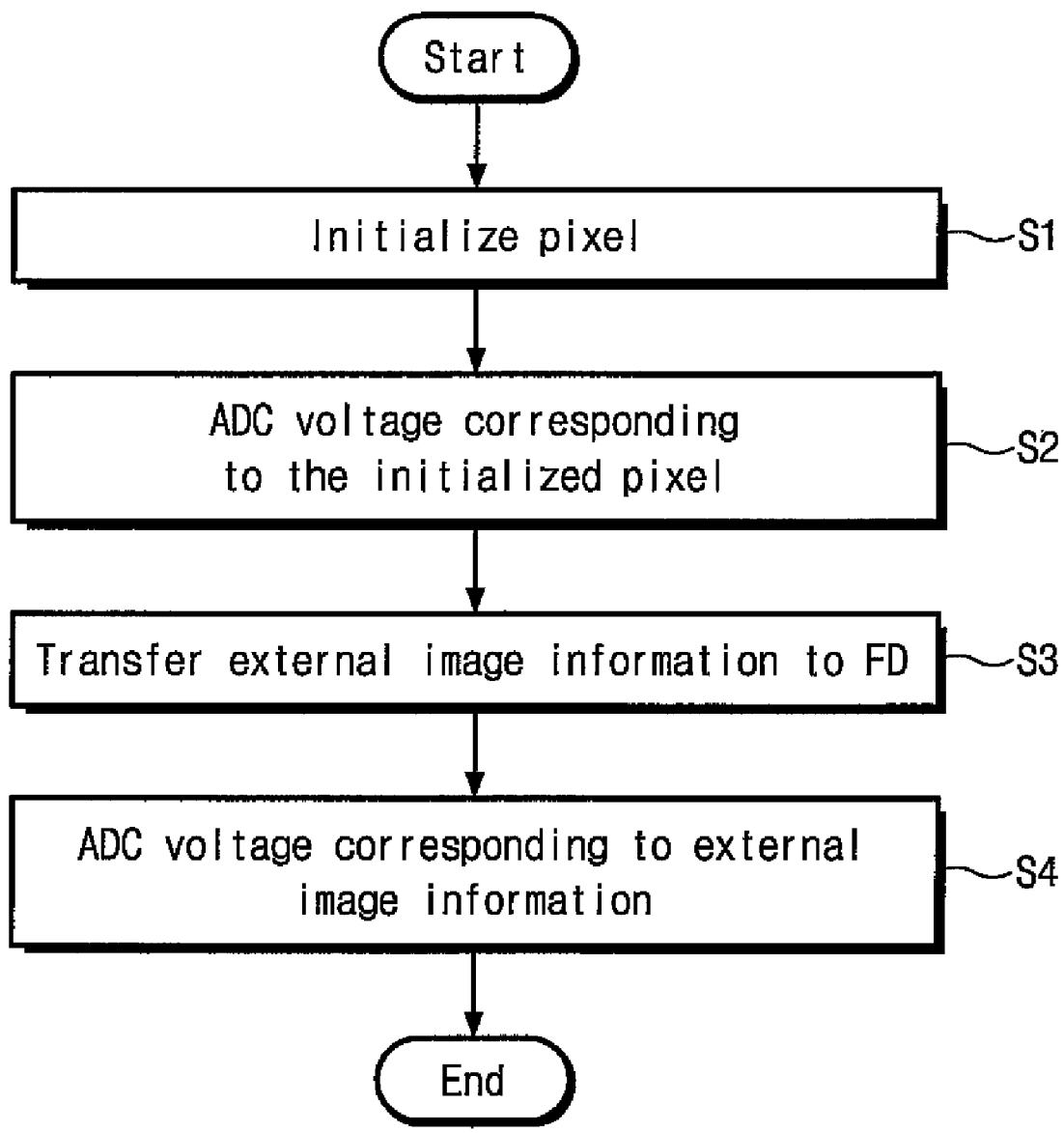
FIG. 7 is a flow chart showing a digital double-sampling sequence of the CMOS image sensor, according to an exemplary embodiment of the present invention.

FIG. 6 is a timing diagram showing an operation of the CMOS image sensor 100 according to an exemplary embodiment of the present invention, and FIG. 7 is a flow chart showing a digital double-sampling sequence of the CMOS image sensor 100 according to an exemplary embodiment of the present invention. Referring to FIGS. 2 through 7, operation of the CMOS image sensor 100 is roughly divided into an initial mode and an image input mode. The initial mode initializes the pixel 20 (S 1) and differentiates an initialized pixel voltage by the ADC 30 (S2). The image input mode transfers external image information into the pixel 20 (S3) and differentiates a voltage by the ADC 30 (S4) corresponding to the external image information.

In the step S1, when the timing controller 10 activates the reset and selection signals Rx and Sel to initialize the pixel 20, a voltage Vrst is generated from the sensing node FD corresponding to the initialized pixel 20. In the step S2, the comparator 31 operates to compare the voltage Vrst of the sensing node FD with the voltage Vr of the ramp signal. The comparator 31 outputs the comparison signal LATCH to the timing controller 10.

In the step S2, the timing controller 10 activates the clock signal CLK to convert the analog signal, which is generated by the initialization of the pixel 20, into the digital signal Drst. The digital signal Drst is defined as digital data converted from the analog signal Vrst by the initialization of the pixel or the pixel array 20.

In the step S3, when the timing controller 10 activates the transmission and selection signals Tx and Sel to input external image information into the pixel 20, a voltage Vsig is generated from the sensing node FD corresponding to the external image information. In the step S4, the comparator 31 operates to compare the voltage Vsig of the sensing node FD with the voltage Vr of the ramp signal. The comparator 31 outputs the comparison signal LATCH to the timing controller 10.

In the step S4, the timing controller 10 activates the clock signal CLK to obtain the digital signal Dsig from the analog signal Vsig that is generated from the external image information of the pixel array 20. Dsig is defined as a digital signal converted from the analog signal Vsig that is generated from the external image information of the pixel array 20. That is, the DDS operation is the procedure for obtaining a value of Dsig−Drst.

As previously described, the pixel does not include a source follower. Since an output of the pixel without a source follower is directly connected to the comparator, dynamic range is extended and noise is reduced.

While the present invention has been described with reference to exemplary embodiments, it will be apparent to those skilled in the art that various changes and modifications may be made without departing from the spirit and scope of the present invention. Therefore, it should be understood that the above embodiments are not limiting, but illustrative. Thus, the scope of the present invention is to be determined by the broadest permissible interpretation of the following claims and their equivalents, and shall not be restricted or limited by the foregoing description.

What is claimed is:

1. An image sensor comprising:
 a first transistor connected between a power source voltage and a sensing node, the first transistor controlled by a first signal;
 a second transistor connected between the sensing node and a first node, the second transistor controlled by a second signal;
 a photodiode connected between the first node and a ground voltage;
 a third transistor connected between a fifth node and a second node, the third transistor controlled by the sensing node;
 a fourth transistor connected between the power source voltage and the fifth node, the fourth transistor controlled by the fifth node;
 a fifth transistor connected between the power source voltage and a third node, the fifth transistor controlled by the fifth node;
 a sixth transistor connected between the third node and a fourth node, the sixth transistor controlled by a reference voltage signal;
 a sixth node connected between the fourth node and the second node; and a current source connected between the sixth node and the ground voltage.

2. The image sensor as set forth in claim 1, wherein the sensing node is initialized in response to the first signal; a sensing signal, corresponding to image information input from the photodiode, is output to the sensing node in response to the second signal; the sensing signal is compared with the reference voltage signal; and an analog voltage signal is output corresponding to a difference between the sensing signal and the reference voltage signal.

3. The image sensor as set forth in claim 1, further comprising:
a pixel, comprising the first transistor, the second transistor, the photodiode, and the third transistor.

4. The image sensor as set forth in claim 3, wherein the pixel further comprises a seventh transistor, connected between the second node and the current source, and controlled by a selection signal activating the pixel.

5. The image sensor as set forth in claim 1, further comprising:
a comparator, comprising the third transistor, the fourth transistor, the fifth transistor, the sixth transistor, and the current source.

6. A digital camera comprising the image sensor according to claim 1.

7. A CMOS image sensor, comprising:
a pixel comprising a photodiode, a first transistor connected between a power source voltage and a sensing node, a second transistor connected between the sensing node and the photodiode, a third transistor gated to the sensing node and connected between a fifth node and a second node, and a fourth transistor connected between the second node and a current source; and
a differential amplifier configured to compare a sensing signal at the sensing node and a ramp voltage signal generated by a ramp voltage generator, the differential amplifier comprising the third and fourth transistors of the pixel, a fifth transistor gated to the ramp voltage generator and connected between a third node and a fourth node, a sixth transistor connected between the fourth node and the current source, a seventh transistor gated to the fifth node and connected between the power source voltage and the fifth node, and an eighth transistor gated to the fifth node and connected between the power source voltage and the third node,
wherein a difference between the sensing signal and the ramp voltage signal is provided at the third node.

8. The CMOS image sensor as set forth in claim 7, wherein a voltage level of the ramp voltage signal decreases over time.

9. The CMOS image sensor as set forth in claim 7, wherein the first transistor is gated to a timing controller to receive a reset signal for initializing the pixel.

10. The CMOS image sensor as set forth in claim 9, wherein the second transistor is gated to the timing controller to receive a transmission signal for transferring the sensing signal from the photodiode to the sensing node.

11. The CMOS image sensor as set forth in claim 10, wherein the fourth transistor is gated to the timing controller to receive a selection signal for activating the pixel.

* * * * *